US009093487B2

(12) United States Patent
Nagai

(10) Patent No.: US 9,093,487 B2
(45) Date of Patent: Jul. 28, 2015

(54) SUBSTRATE MOUNTING TABLE AND SUBSTRATE PROCESSING APPARATUS

(71) Applicant: TOKYO ELECTRON LIMITED, Tokyo (JP)

(72) Inventor: Tsutomu Nagai, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 72 days.

(21) Appl. No.: 13/914,675

(22) Filed: Jun. 11, 2013

(65) Prior Publication Data

US 2013/0342952 A1     Dec. 26, 2013

Related U.S. Application Data

(60) Provisional application No. 61/663,106, filed on Jun. 22, 2012.

(30) Foreign Application Priority Data

Jun. 12, 2012   (JP) ................. 2012-133080

(51) Int. Cl.
*H01T 23/00*     (2006.01)
*H01L 21/683*    (2006.01)
*H01L 21/67*     (2006.01)

(52) U.S. Cl.
CPC ...... *H01L 21/6833* (2013.01); *H01L 21/67126* (2013.01); *H01L 21/6831* (2013.01)

(58) Field of Classification Search
USPC ................................. 361/234, 230
See application file for complete search history.

(56) References Cited

U.S. PATENT DOCUMENTS

| 5,870,271 A | * | 2/1999 | Herchen ................ 361/234 |
| 5,919,332 A | * | 7/1999 | Koshiishi et al. ........ 156/345.47 |
| 2005/0042881 A1 | | 2/2005 | Nishimoto et al. |

FOREIGN PATENT DOCUMENTS

JP     2005-33181 A     2/2005

* cited by examiner

*Primary Examiner* — Danny Nguyen
(74) *Attorney, Agent, or Firm* — Rothwell, Figg, Ernst & Manbeck, P.C.

(57) ABSTRACT

A substrate processing apparatus includes a processing chamber and a substrate mounting table. The processing chamber defines a processing space. The substrate mounting table includes a base and an electrostatic chuck, and is disposed in the processing space. The base has a coolant path formed therein. The electrostatic chuck is provided on the upper surface of the base through an adhesive layer formed by curing a liquid adhesive, and has an electrode therein. Here, a first adhesive region is provided on the upper surface of the base, and is adhered to the electrostatic chuck through the adhesive layer. The first adhesive region has a center portion recessed compared with the end portion of the first adhesive region.

16 Claims, 3 Drawing Sheets

SUBSTRATE MOUNTING TABLE AND SUBSTRATE PROCESSING APPARATUS

CROSS-REFERENCE TO RELATED APPLICATIONS

This application claims priority to Japanese Patent Application No. 2012-133080 filed on Jun. 12, 2012 and U.S. Provisional Application No. 61/663,106 filed on Jun. 22, 2012, the entire contents of which are incorporated herein by reference.

FIELD OF THE INVENTION

Various aspects and embodiments of the present invention relate to a substrate mounting table and a substrate processing apparatus.

BACKGROUND OF THE INVENTION

Conventionally, there has been known a substrate mounting table including an electrostatic chuck having therein an electrode for electrostatic adsorption and a base for adjusting the temperature of the electrostatic chuck (see, e.g., Japanese Patent Application Publication No. 2005-33181). In the substrate mounting table disclosed in the above-cited reference, the electrostatic chuck and the base are adhesively integrated with each other through an adhesive layer. The upper surface of the base has a substantially mesa shape, and the electrostatic chuck is disposed on the upper surface (mounting surface) of the mesa plateau. The upper surface of the electrostatic chuck has a larger surface area than the mounting surface. As a result, the electrostatic chuck is disposed in a state where its edge protrudes radially outwardly beyond the mounting surface. Around the side surface of the adhesive layer, a flexible coating member with a resistance to plasma is provided. The coating member is tightly attached on the side surface of the electrostatic chuck, an end portion of the lower surface of the electrostatic chuck, and the upper surface (periphery) of the base other than the mesa plateau. As another example, the coating member is tightly attached on the side surface of the electrostatic chuck, the end portion of the lower surface of the electrostatic chuck, the upper surface of the base other than the mesa plateau, and the side surface of the mesa plateau of the base. Accordingly, the deterioration of the adhesive layer may be prevented because the side peripheral surface of the adhesive layer is protected by the coating member from active species and the like generated by a plasma.

However, when heat is applied to the substrate mounting table disclosed in the above-cited reference, the coating member may be subjected to a significant thermal expansion/contraction depending on the material of the coating member. In the case when the coating member is largely thermally expanded, the adhesive layer may be peeled off due to a force pushing up the end portion of the lower surface of the electrostatic chuck. Further, when the coating member is largely thermally contracted, a gap may be formed between the coating member and the end portion of the lower surface of the electrostatic chuck and the plasma or the like may enter the gap. Therefore, in the art, there have been required a substrate mounting table and a substrate processing apparatus capable of adequately protect the adhesive layer bonding the base and the electrostatic chuck together.

SUMMARY OF THE INVENTION

In accordance with an aspect of the present invention, there is provided a substrate processing apparatus including a processing chamber and a substrate mounting table. The processing chamber defines a processing space. The substrate mounting table includes a base, an electrostatic chuck and a sealing member. The base has a coolant path formed therein and an annular protruding portion formed to protrude upward along a circumferential direction on an edge portion of the upper surface of the base. The electrostatic chuck is provided on the upper surface of the base at an inner side of the protruding portion through an adhesive layer in a state where it is separated from the protruding portion, and has an electrode therein. The sealing member has an annular shape, and is disposed on the upper surface of the base between a side surface of the protruding portion and a side surface of the electrostatic chuck such that the sealing member makes close contact with the side surface of the protruding portion and the side surface of the electrostatic chuck.

In accordance with another aspect of the present invention, there is provided a substrate mounting table including a base, an electrostatic chuck and a sealing member. The base has a coolant path formed therein and an annular protruding portion formed to protrude upward along a circumferential direction on an edge portion of the upper surface of the base. The electrostatic chuck is provided on the upper surface of the base at an inner side of the protruding portion through an adhesive layer in a state where it is separated from the protruding portion, and has an electrode therein. The sealing member has an annular shape, and is disposed on the upper surface of the base between a side surface of the protruding portion and a side surface of the electrostatic chuck such that the sealing member makes close contact with the side surface of the protruding portion and the side surface of the electrostatic chuck.

DETAILED DESCRIPTION OF THE EMBODIMENTS

Figure 1:
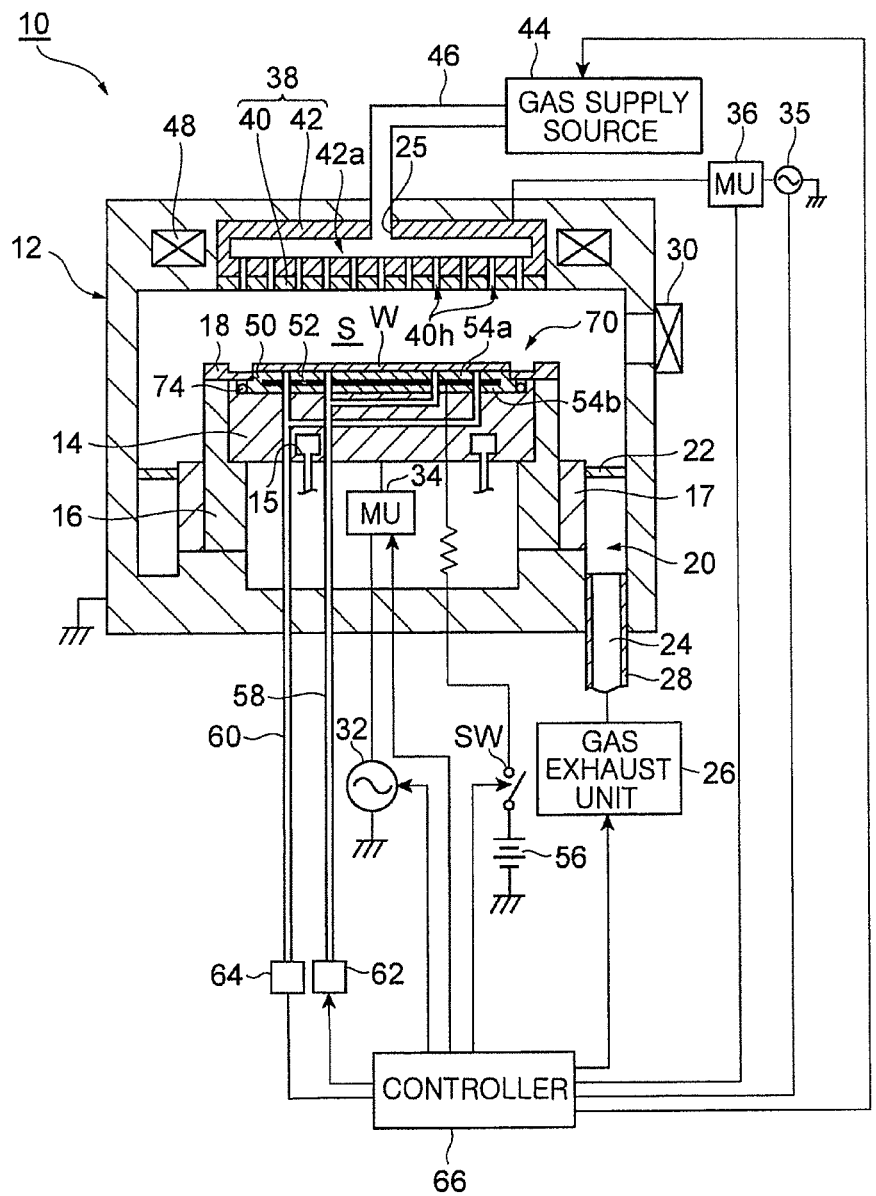
FIG. 1 is a diagram schematically showing a substrate processing apparatus in accordance with an embodiment of the present invention.

Hereinafter, various embodiments of the present invention will be described in detail with reference to the accompanying drawings. Throughout the drawings, like reference numerals will be given to like parts having substantially the same function and configuration.

FIG. 1 is a diagram schematically showing a substrate processing apparatus in accordance with an embodiment of the present invention. FIG. 1 shows a cross-section of the substrate processing apparatus in accordance with the embodiment of the present invention. The substrate processing apparatus 10 shown in FIG. 1 is a parallel plate type plasma processing apparatus.

The plasma processing apparatus 10 includes a processing chamber 12. The processing chamber 12 has a substantially cylindrical shape and defines a processing space S therein. The plasma processing apparatus 10 includes a substantially disc-shaped base 14 in the processing chamber 12. The base 14 is disposed at a lower portion of the processing space S. The base 14 is made of, e.g., aluminum, and constitutes a second electrode. The base 14 has a function of absorbing the heat of an electrostatic chuck 50 to cool the electrostatic chuck 50, which will be later described.

A coolant path 15 for coolant is formed in the base 14, and a coolant inlet line and a coolant outlet line are connected to the coolant path 15. By circulating a suitable coolant, such as cooling water or the like, in the coolant path 15, it is possible to control the temperature of the electrostatic chuck 50 and the base 14 to a predetermined temperature.

In the present embodiment, the plasma processing apparatus 10 further includes a cylindrical support 16 and a cylindrical supporting member 17. The cylindrical support 16 is in contact with the edges of the side and bottom surfaces of the base 14 to support the base 14. The cylindrical supporting member 17 vertically extends upward from the bottom of the processing chamber 12 to support the base 14 via the cylindrical support 16. The plasma processing apparatus 10 further includes a focus ring 18 disposed on the upper surface of the cylindrical support 16. The focus ring 18 is made of, for example, silicon, quartz, or the like.

In the present embodiment, an exhaust passage 20 is formed between the cylindrical supporting member 17 and a sidewall of the processing chamber 12. A baffle plate 22 is attached to the inlet of the exhaust passage 20 or in the middle of the exhaust passage 20. Further, an exhaust port 24 is provided at the bottom of the exhaust passage 20. The exhaust port 24 is defined by an exhaust pipe 28 that is fitted to the bottom of the processing chamber 12. The exhaust pipe 28 is connected to a gas exhaust unit 26. The gas exhaust unit 26 has a vacuum pump and can depressurize the processing space S of the processing chamber 12 to a predetermined vacuum level. A gate valve 30 for opening and closing a loading/unloading port for a target object (substrate) W is provided at the sidewall of the processing chamber 12.

A high frequency power supply 32 for plasma generation is electrically connected to the base 14 via a matching unit (MU) 34. The high frequency power supply 32 applies a high frequency power of a predetermined high frequency (e.g., 27 MHz or above) to the second electrode, i.e., the base 14.

The plasma processing apparatus 10 further includes a shower head 38 in the processing chamber 12. The shower head 38 is provided at an upper portion of the processing space S. The shower head 38 includes an electrode plate 40 and an electrode holder 42.

The electrode plate 40 is a substantially disc-shaped conductive plate and is fixed by screws or the like to the electrode holder 42. The electrode plate 40 and the electrode holder 42 constitute a first electrode. A high frequency power supply 35 for plasma generation is electrically connected to the electrode holder 42 via a matching unit (MU) 36. The high frequency power supply 35 applies a high frequency power of a predetermined high frequency (e.g., 27 MHz or above) to the electrode holder 42. A high frequency electric field is generated in the processing space S between the base 14 and the electrode plate 40 when the high frequency power supplies 32 and 35 apply high frequency powers to the base 14 and the electrode plate 40, respectively.

A plurality of gas vent holes 40h is formed in the electrode plate 40. The electrode plate 40 is detachably held by the electrode holder 42. A buffer space 42a is defined in the electrode holder 42. The plasma processing apparatus 10 further includes a gas supply source 44 connected to a gas inlet port 25 of the buffer space 42a through a gas supply line 46. The gas supply source 44 supplies a processing gas into the processing space S. For example, the gas supply source 44 can supply a CF-based etching gas. In the electrode holder 42, a plurality of gas holes is formed to communicate with the respective gas vent holes 40h and the buffer space 42a. Thus, the gas from the gas supply source 44 is supplied to the processing space S through the buffer chamber 42a and the gas vent holes 40h.

In the present embodiment, a magnetic field generating mechanism 48 arranged annually or concentrically is provided in the ceiling portion of the processing chamber 12. The magnetic field generating mechanism 48 serves to make easy the start of a high frequency power discharge (plasma ignition) in the processing space S and to maintain a stable discharge.

In the present embodiment, the electrostatic chuck 50 is disposed on the upper surface of the base 14. The electrostatic chuck 50 is a member that is substantially disk-shaped. The electrostatic chuck 50 includes an electrode 52 and a pair of insulating films 54a and 54b. The insulating films 54a and 54b are formed of an insulating material, such as ceramic or the like. The electrode 52 is a conductive film disposed between the insulating films 54a and 54b. That is, the electrostatic chuck 50 includes the electrode 52 therein. A DC power supply 56 is connected to the electrode 52 via a switch SW. When a DC voltage is applied to the electrode 52 from the DC power supply 56, a Coulomb force is generated, and the wafer W is attracted and held on the electrostatic chuck 50 by the Coulomb force. A heater 53 (see FIGS. 2 to 3C), as a heating element, is disposed on the lower surface of the electrostatic chuck 50 to heat the wafer W to a predetermined temperature. The heater 53 is connected to a heater power supply (not shown) through wiring. The electrostatic chuck 50 and the base 14 constitute a mounting table 70.

In the present embodiment, the plasma processing apparatus 10 further includes gas supply lines 58 and 60, and heat transfer gas supply units 62 and 64. The heat transfer gas supply unit 62 is connected to the gas supply line 58. The gas supply line 58 extends to the upper surface of the electrostatic chuck 50 and also extends annularly in a central portion of the corresponding upper surface. The heat transfer gas supply unit 62 supplies a heat transfer gas, such as He gas, between the upper surface of the electrostatic chuck 50 and the wafer W. Further, the heat transfer gas supply unit 64 is connected to the gas supply line 60. The gas supply line 60 extends to the upper surface of the electrostatic chuck 50 and also extends annularly to surround the gas supply line 58 in the corresponding upper surface. The heat transfer gas supply unit 64 supplies a heat transfer gas, such as He gas, between the upper surface of the electrostatic chuck 50 and the wafer W.

In the present embodiment, the plasma processing apparatus 10 further includes a controller 66. The controller 66 is connected to the gas exhaust unit 26, the switch SW, the high frequency power supplies 32 and 35, the matching units 34 and 36, the gas supply source 44, and the heat transfer gas supply units 62 and 64. The controller 66 sends individual control signals to the gas exhaust unit 26, the switch SW, the high frequency power supplies 32 and 35, the matching units 34 and 35, the gas supply source 44, and the heat transfer gas supply units 62 and 64. The controller 66 sends control signals to the gas exhaust unit 26 to exhaust the gas, the switch SW to open and close, the high frequency power supplies 32 and 35 to supply power, the matching units 34 and 36 to control impedance, the gas supply source 44 to supply the processing gas, and the heat transfer gas supply units 62 and 64 to individually supply the heat transfer gas. Further, the controller 66, connected to the heater power supply (not shown), controls the temperature of the wafer W by controlling the current supplied to the heater, which will be later described.

In the plasma processing apparatus 10, the processing gas is supplied into the processing space S from the gas supply source 44. Further, a high frequency electric field is formed between the electrode plate 40 and the base 14, i.e., in the processing space S. Thus, plasma is generated in the processing space S and the wafer W is etched by, e.g., radicals (e.g., oxygen radicals) of the element contained in the processing gas.

Figure 2:
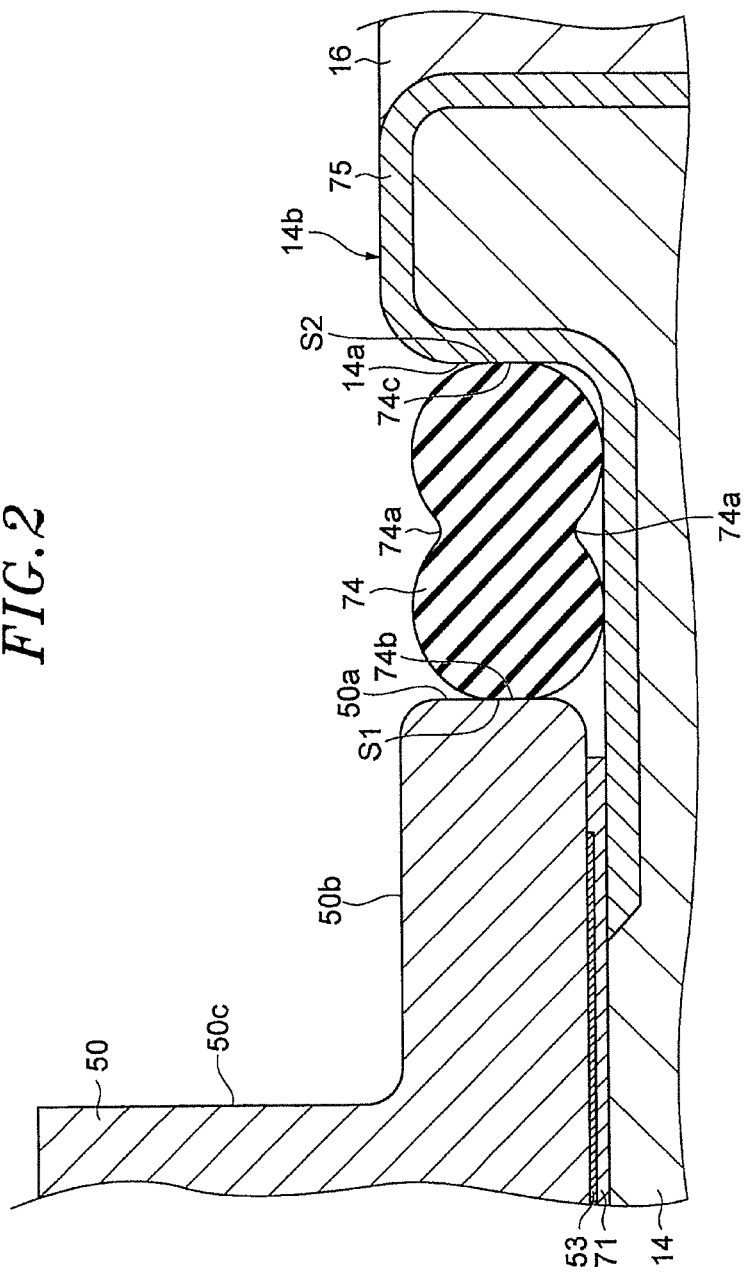
FIG. 2 is a partially enlarged cross-sectional view of the substrate mounting table in accordance with the embodiment of the present invention.

The configuration of the mounting table 70 will now be described in detail. FIG. 2 is a partially enlarged cross-sectional view of the mounting table 70 shown in FIG. 1. As shown in FIG. 2, at the upper surface of the base 14, the electrostatic chuck 50 is provided through an adhesive layer 71. The adhesive layer 71 is formed by curing a liquid adhesive. As the liquid adhesive, for example, an organic adhesive including a silicon-based material, an acrylic-based or acrylate-based material, or a polyimide-silica-based material may be used.

At an edge portion of the upper surface of the base 14, a protruding portion 14b is formed to protrude upward (in a direction perpendicular to the radial direction). On the inner side of the protruding portion 14b which is formed in an annular shape in a circumferential direction on the upper surface of the base 14, the electrostatic chuck 50 is bonded through the adhesive layer 71 in a state where it is separated from the protruding portion 14b. Further, a protective layer 75 may be provided by spraying the surface of the base 14.

The electrostatic chuck 50 is a disk-shaped member having a lower portion 50b protruding radially outward. The thickness of the lower portion 50b is thinner than or substantially the same as the protruding width (height) of the protruding portion 14b; and the focus ring 18 mounted on the upper surface of the protruding portion 14b is disposed in the vicinity of an upper side surface 50c of the electrostatic chuck 50. A side surface 50a of the lower portion 50b and a side surface 14a of the protruding portion 14b are parallel with each other.

Between the side surface 14a of the protruding portion 14b and the side surface 50a of the electrostatic chuck 50, a sealing member 74 for protecting the adhesive layer 71 is disposed on the upper surface of the base 14. The sealing member 74 is an annular member with a substantially elliptical cross-section. The thickness of the sealing member 74 in the perpendicular direction to the longitudinal direction of the elliptical cross-section is thinner than the protruding height of the protruding member 14b. The sealing member 74 is formed of a material having plasma resistance and elasticity, and, for example, a fluorine-based resin (e.g., perfluoroelastomer) is used as the material.

The sealing member 74 has a stress alleviation portion for alleviating the stress applied between the side surface 14a of the protruding portion 14b and the side surface 50a of the electrostatic chuck 50. As an example of the stress alleviation portion, a recess (neck portion) 74a is formed in the center portion of the sealing member 74. The center portion of the sealing member 74 is most expanded in the perpendicular direction to the longitudinal direction of the elliptical cross-section when force is applied to the sealing member 74 in the longitudinal direction of the elliptical cross-section. By forming the recess 74a in the center portion, it is possible to suppress the expansion in the perpendicular direction to the longitudinal direction of the elliptical cross-section. The recess 74a is formed in pair at opposite positions in the perpendicular direction to the longitudinal direction of the elliptical shape. Further, the depth of the recess 74a is determined by a simulation or the like to optimally alleviate the stress applied to the electrostatic chuck 50, the base 14, and the sealing member 74.

The sealing member 74 is press-fitted between the side surface 14a of the protruding portion 14b and the side surface 50a of the electrostatic chuck 50 to make close contact with the side surfaces 14a and 50a. Here, one end 74c, in the longitudinal direction of the elliptical cross-section, of the sealing member 74 is in close contact with the side surface 14a of the protruding portion 14b; and the other end 74b, in the longitudinal direction of the elliptical cross-section, of the sealing member 74 is in close contact with the side surface 50a of the electrostatic chuck 50. In other words, the sealing member 74 is disposed such that a pushing force is exerted to the side surface 14a of the protruding portion 14b and the side surface 50a of the electrostatic chuck 50. As a result, a sealing surface S1 is formed between the sealing member 74 and the side surface 50a, and a sealing surface S2 is formed between the sealing member 74 and the side surface 14a. Further, the sealing member 74 having the elliptical cross-section is arranged as described above, as compared with a case of a circular cross-section, can reduce an upward expansion thereof while securing a large space between the protruding portion 14b and the electrostatic chuck 50.

In the present embodiment, the adhesive layer 71 is provided with the heater 53. The heater 53 is disposed on the lower surface of the electrostatic chuck 50. The heater 53, for example, adheres to the lower surface of the electrostatic chuck 50 by an adhesive resin, such as epoxy.

As described above, in the substrate processing apparatus 10 in accordance with the present embodiment, the annular sealing member 74 is disposed between the protruding portion 14b provided at the edge portion of the upper surface of the base 14 and the electrostatic chuck 50 to make close contact with the side surface 50a of the electrostatic chuck and the side surface 14a of the protruding portion 14b. In this way, by sealing the adhesive layer 71 in the horizontal direction, it is possible to protect the adhesive layer 71. Further, even if the space between the protruding portion 14b and the electrostatic chuck 50 is narrowed by heat, since the sealing member 74 is not in close contact in the upward direction, it is possible to avoid applying an upward force to the electrostatic chuck 50 and other members. Therefore, it is possible to adequately protect the adhesive layer 71 not to be peeled off. Further, even if the space between the protruding portion 14b and the electrostatic chuck 50 is widened by heat, the sealing member 74, which is in close contact with the side surface 50a of the electrostatic chuck and the side surface 14a of the protruding portion to apply a pushing force thereto in the horizontal direction, can maintain a sealed state by extending in the horizontal direction to follow the widen space between the electrostatic chuck 50 and the protruding portion 14b. Therefore, it is possible to properly protect the adhesive layer 71 without exposing the adhesive layer 71 to plasma or the like.

Further, in the substrate processing apparatus 10 in accordance with the present embodiment, the sealing member 74 has a substantially elliptical cross-section and the recess 74a is depressed in the perpendicular direction to the longitudinal direction of the elliptical cross-section. Accordingly, even if a force is applied to the sealing member 74 in the longitudinal direction of the elliptical cross-section due to the narrowing space between the electrostatic chuck 50 and the protruding portion 14b, the stress can be alleviated at the recess 74a to suppress the upward expansion of the sealing member 74.

Furthermore, in the present embodiment, the sealing member is configured such that the thickness thereof in the perpendicular direction to the longitudinal direction of the elliptical cross-section is thinner than the protruding width of the protruding portion 14b. Accordingly, even if a force is applied to the sealing member 74 in the longitudinal direction of the elliptical cross-section due to the narrowing space between the electrostatic chuck 50 and the protruding portion 14b, it is difficult for the recess 74a to protrude upward beyond the protruding portion 14b.

Figure 3A:
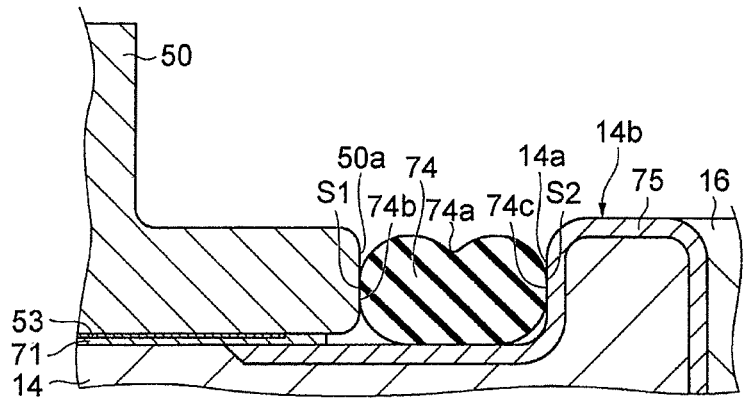
FIGS. 3A to 3C are schematic views for explaining modifications of the embodiment of the present invention.
Figure 3B:
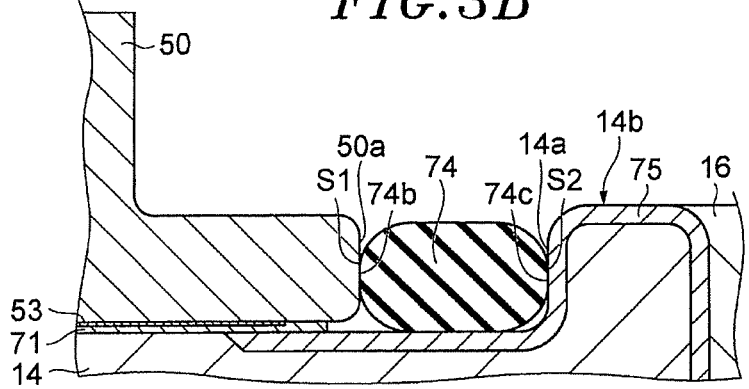
Figure 3C:
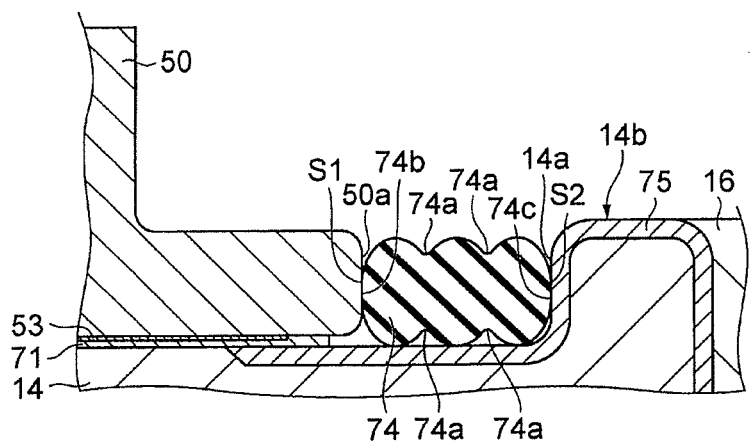

The present invention is not limited to the above embodiment. FIGS. 3A to 3C are schematic views showing modifications of the above embodiment. In the above embodiment, two recesses 74a are formed opposite to each other; however, as shown in FIG. 3A, the recess 74a may be formed only on the top side. Further, as shown in FIG. 3B, the sealing member 74 may not include the recess 74a. Alternatively, as shown in FIG. 3C, a plurality of the recesses 74a may be formed along the longitudinal direction of the elliptical cross-section.

The plasma processing apparatus has been described as an example of a substrate processing apparatus in the above embodiment, but the present invention is not limited thereto. A thermal CVD apparatus or another vapor deposition apparatus may be employed. Further, an etching apparatus, a film forming apparatus, and the like may also be employed. That is, any apparatus for processing a substrate may be employed without limiting the use or the configuration thereof.

In the above embodiment, the adhesive layer 71 has the heater 53, but the heater 53 may not be provided. Further, the heater 53 may be provided in the electrostatic chuck 50.

In the above embodiment, the adhesive layer 71 is formed of a single adhesive layer, but the adhesive layer 71 may be formed of multiple layers of multiple adhesives. Further, the base 14 and the electrostatic chuck 50 may be bonded together in combination with an adhesive sheet.

While the invention has been shown and described with respect to the embodiments, it will be understood by those skilled in the art that various changes and modifications may be made without departing from the scope of the invention as defined in the following claims.

What is claimed is:

1. A substrate processing apparatus, comprising:
a processing chamber defining a processing space; and
a substrate mounting table disposed in the processing space,
   wherein the substrate mounting table includes:
      a base having a coolant path formed therein, and an annular protruding portion formed to protrude upward along a circumferential direction on an edge portion of an upper surface of the base;
      an electrostatic chuck having an electrode therein, the electrostatic chuck provided on the upper surface of the base at an inner side of the protruding portion through an adhesive layer in a state where it is separated from the protruding portion; and
      an annular sealing member disposed on the upper surface of the base between a side surface of the protruding portion and a side surface of the electrostatic chuck which are opposite to each other, the sealing member making close contact with the side surface of the protruding portion and the side surface of the electrostatic chuck,
   wherein the sealing member has a substantially elliptical cross-section, and
   wherein ends of the sealing member in a longitudinal direction of the elliptical cross-section make close contact with the side surface of the protruding portion and the side surface of the electrostatic chuck, respectively.

2. The substrate processing apparatus of claim 1, wherein the side surface of the protruding portion and the side surface of the electrostatic chuck are parallel with each other.

3. The substrate processing apparatus of claim 1, wherein the sealing member has a stress alleviation portion configured to alleviate a stress applied between the side surface of the protruding portion and the side surface of the electrostatic chuck.

4. The substrate processing apparatus of claim 2, wherein the sealing member has a stress alleviation portion configured to alleviate a stress applied between the side surface of the protruding portion and the side surface of the electrostatic chuck.

5. The substrate processing apparatus of claim 3, wherein the stress alleviation portion is a recess formed in a direction perpendicular to the longitudinal direction of the elliptical cross-section.

6. The substrate processing apparatus of claim 4, wherein the stress alleviation portion is a recess formed in a direction perpendicular to the longitudinal direction of the elliptical cross-section.

7. The substrate processing apparatus of claim 3, wherein the stress alleviation portion includes recesses oppositely formed in a direction perpendicular to the longitudinal direction of the elliptical cross-section.

8. The substrate processing apparatus of claim 4, wherein the stress alleviation portion includes recesses oppositely formed in a direction perpendicular to the longitudinal direction of the elliptical cross-section.

9. The substrate processing apparatus of claim 3, wherein the stress alleviation portion includes recesses formed at positions disposed in the longitudinal direction of the elliptical cross-section.

10. The substrate processing apparatus of claim 4, wherein the stress alleviation portion includes recesses formed at positions disposed in the longitudinal direction of the elliptical cross-section.

11. The substrate processing apparatus of claim 1, wherein the sealing member has a thickness in a direction perpendicular to the longitudinal direction of the elliptical cross-section thinner than a protruding width of the protruding portion.

12. The substrate processing apparatus of claim 2, wherein the sealing member has a thickness in a direction perpendicular to the longitudinal direction of the elliptical cross-section thinner than a protruding width of the protruding portion.

13. The substrate processing apparatus of claim 3, wherein the sealing member has a thickness in a direction perpendicular to the longitudinal direction of the elliptical cross-section thinner than a protruding width of the protruding portion.

14. The substrate processing apparatus of claim 4, wherein the sealing member has a thickness in a direction perpendicular to the longitudinal direction of the elliptical cross-section thinner than a protruding width of the protruding portion.

15. The substrate processing apparatus of claim 5, wherein the sealing member has a thickness in the direction perpendicular to the longitudinal direction of the elliptical cross-section thinner than a protruding width of the protruding portion.

16. A substrate mounting table comprising:
a base having a coolant path formed therein, and an annular protruding portion formed to protrude upward along a circumferential direction on an edge portion of the upper surface of the base;
an electrostatic chuck having an electrode therein, the electrostatic chuck provided on the upper surface of the base at an inner side of the protruding portion through an adhesive layer in a state where it is separated from the protruding portion; and
an annular sealing member disposed on the upper surface of the base between a side surface of the protruding portion and a side surface of the electrostatic chuck which are opposite to each other, the sealing member making close contact with the side surface of the protruding portion and the side surface of the electrostatic chuck,
wherein the sealing member has a substantially elliptical cross-section, and
wherein ends of the sealing member in a longitudinal direction of the elliptical cross-section make close contact with the side surface of the protruding portion and the side surface of the electrostatic chuck, respectively.

* * * * *